(12) United States Patent
Park et al.

(10) Patent No.: US 10,937,670 B2
(45) Date of Patent: Mar. 2, 2021

(54) MEGASONIC CLEANER

(71) Applicant: SAMSUNG ELECTRONICS CO., LTD., Suwon-si (KR)

(72) Inventors: Sung-Yong Park, Suwon-si (KR);
Sung-Hyup Kim, Hwaseong-si (KR);
Sung-Gwang Lee, Hwaseong-si (KR);
Kwang-Sung Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 421 days.

(21) Appl. No.: 15/870,456

(22) Filed: Jan. 12, 2018

(65) Prior Publication Data
US 2019/0013218 A1 Jan. 10, 2019

(30) Foreign Application Priority Data
Jul. 6, 2017 (KR) .......................... 10-2017-0085927

(51) Int. Cl.
*H01L 21/67* (2006.01)
*H01L 21/02* (2006.01)
*B08B 3/12* (2006.01)

(52) U.S. Cl.
CPC .......... *H01L 21/67057* (2013.01); *B08B 3/12* (2013.01); *H01L 21/02052* (2013.01); *H01L 21/67086* (2013.01); *B08B 2203/0288* (2013.01)

(58) Field of Classification Search
CPC ... A61L 2/025; B08B 3/12; B08B 2203/0288; B08B 2209/005; A47L 15/13; A47L 2601/17; B01J 19/10; H01L 21/02052; H01L 21/6704; H01L 21/67057; H01L 21/67075; H01L 21/67086
See application file for complete search history.

(56) References Cited

U.S. PATENT DOCUMENTS

| | | | |
|---|---|---|---|
| 5,379,785 A | 1/1995 | Ohmori et al. | |
| 6,148,833 A | 11/2000 | Tang et al. | |
| 6,523,557 B2 | 2/2003 | Struven | |
| 7,238,085 B2 * | 7/2007 | Montierth | A61B 8/546 451/36 |
| 8,486,199 B2 | 7/2013 | Holsteyns et al. | |
| 2004/0154639 A1 | 8/2004 | Tolles et al. | |
| 2007/0006892 A1 | 1/2007 | Olesen et al. | |
| 2013/0008473 A1 | 1/2013 | Tuziuti et al. | |

FOREIGN PATENT DOCUMENTS

| | | |
|---|---|---|
| JP | 2014075383 | 4/2014 |
| KR | 10-0526214 | 11/2005 |

\* cited by examiner

*Primary Examiner* — David G Cormier
(74) *Attorney, Agent, or Firm* — F. Chau & Associates, LLC

(57) ABSTRACT

A megasonic cleaner includes a water tank that includes a pair of opposite inner walls and a bottom wall connected thereto, and that accommodates a fluid therein; a plurality of supporting units arranged in the water tank at predetermined positions that support a wafer; and at least one transducer arranged on the bottom wall that transmits energy in the form of waves into the fluid, where each of the opposite inner walls has a first protrusion that protrudes into an internal space of the water tank, the first protrusion being spaced above the bottom wall and positioned at an height that is greater than or equal to a height of the centers of the plurality of supporting units.

10 Claims, 10 Drawing Sheets

MEGASONIC CLEANER

CROSS-REFERENCE TO RELATED APPLICATION

This application claims priority under 35 U.S.C. § 119 from, and the benefit of, Korean Patent Application No. 10-2017-0085927, filed on Jul. 6, 2017 in the Korean Intellectual Property Office, the contents of which are herein incorporated by reference in their entirety.

BACKGROUND

1. Technical Field

Embodiments of the present inventive concept are directed to a semiconductor cleaner, and more particularly, a megasonic cleaner.

2. Discussion of the Related Art

A chemical mechanical polishing (CMP) process can flatten a surface by using a combination of chemical materials and machine power. Fine nano/micro size particles can remain on a wafer through a CMP process. The fine particles that remain on a wafer can cause damage to the wafer in subsequent processes. Accordingly, methods and apparatuses that can efficiently remove fine particles that remain on a wafer after a CMP process has been actively studied.

SUMMARY

Embodiments of the present inventive concept can provide a megasonic cleaner with improved reliability.

Embodiments of the present inventive concept can provide a megasonic cleaner which improves a manufacturing yield.

According to an embodiment of the inventive concept, there is provided a megasonic cleaner, including: a water tank that includes a pair of opposite inner walls and a bottom wall connected thereto that accommodates a fluid therein; a plurality of supporting units arranged at predetermined positions in the water tank and that support a wafer; and at least one transducer arranged on the bottom wall and configured to transmit energy in the form of waves into the fluid, wherein each of the pair of opposite inner walls has a first protrusion that protrudes into an internal space of the water tank, and a shortest distance between the first protrusion and the bottom wall is greater than or equal to the distances between the plurality of supporting units and the bottom wall.

According to another embodiment of the inventive concept, there is provided a megasonic cleaner, including: a water tank that includes a pair of opposite inner walls and a bottom wall connected thereto, and that accommodates a fluid therein; a plurality of supporting units arranged at predetermined positions in the water tank that support a wafer; and first transducers on the bottom wall and configured to transmit energy in the form of first waves into the fluid, and second transducers arranged on the pair of opposite inner walls and configured to transmit energy in the form of second waves into the fluid, wherein the second transducers transmit the second waves above the plurality of the supporting units.

According to another embodiment of the inventive concept, there is provided a megasonic cleaner, including: a water tank that includes a pair of opposite inner walls and a curved bottom wall connected to the pair of opposite inner walls, wherein the water tank accommodates a fluid therein; a plurality of supporting units arranged at predetermined positions in the water tank that support the wafer; and transducers arranged on the bottom wall and configured to transmit energy in the form of waves into the fluid, the transducers being positioned at equal intervals along the bottom wall.

DETAILED DESCRIPTION

Figure 1A:
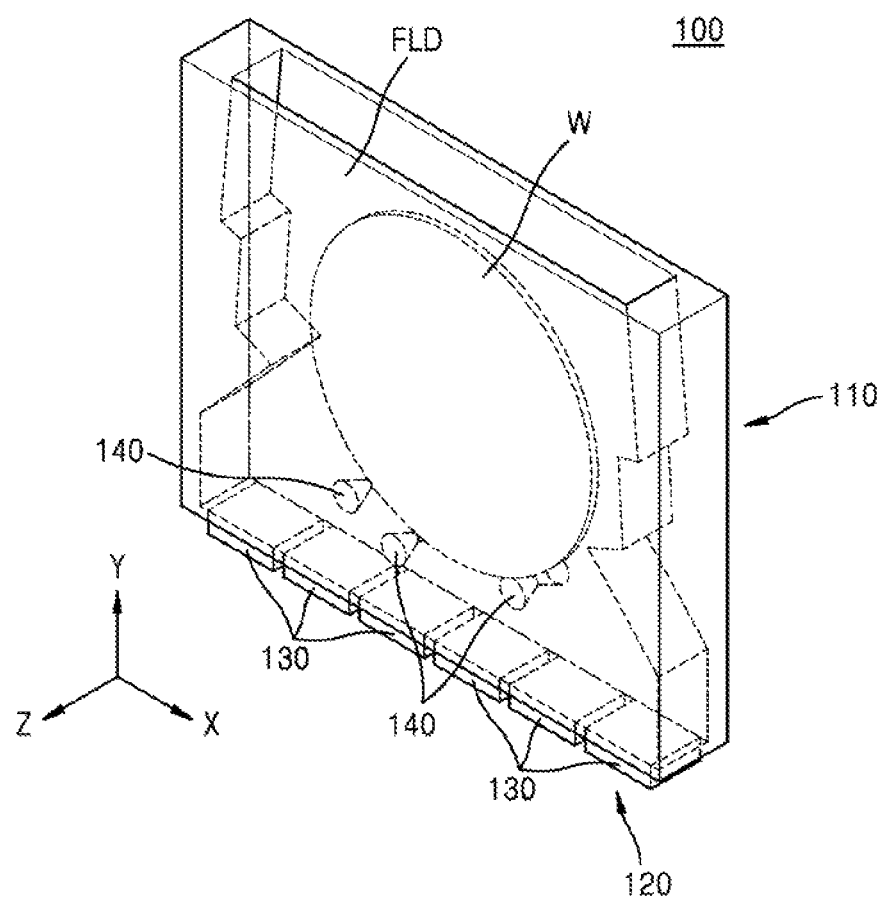
FIG. 1A is a perspective view of an internal water tank included in a megasonic cleaner, according to some embodiments.

Hereinafter, with reference to attached drawings, exemplary embodiments of the present inventive concept will be described in detail. In the drawing figures, dimensions may be exaggerated for clarity of illustration. Like reference numerals may be used to represent the same components in the drawings, and thus, overlapping explanations are omitted.

Figure 1B:
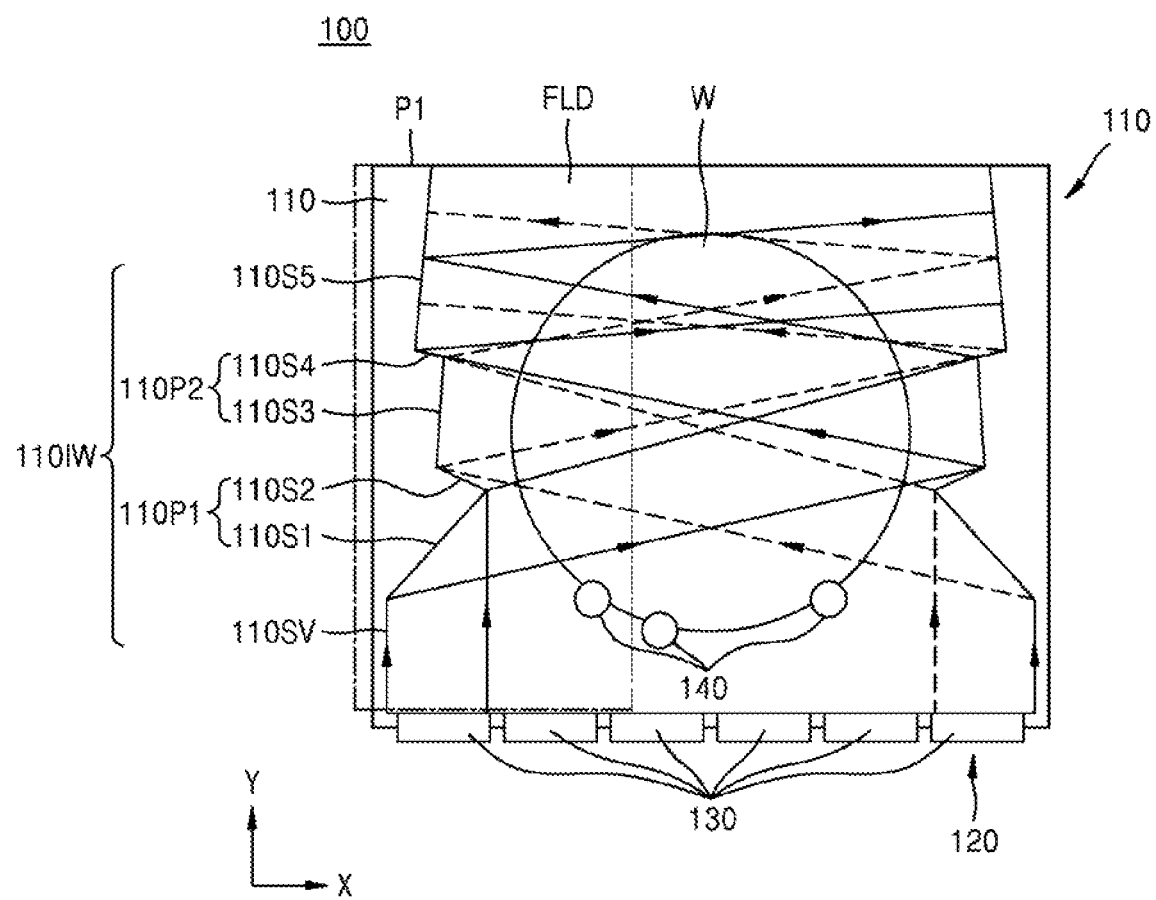
FIGS. 1B through 1E are top plan views of an internal water tank included in a megasonic cleaner, according to some embodiments.

FIG. 1A is a perspective view of a megasonic cleaner according to embodiments of the disclosure. FIG. 1B is a one-way top plan view of a megasonic cleaner in FIG. 1A.

With reference to FIGS. 1A and 1B, the megasonic cleaner according to some embodiments includes an internal water tank 100, a plurality of supporting units 140, and a plurality of transducers 130.

Megasonic cleaning, which is similar to ultrasonic cleaning, is a type of acoustic cleaning. It is a mild cleaning process which causes no damage to a product, such as a circuit device formed on a wafer, etc., and thus, in addition to being used to clean wafers, megasonic cleaning can be used to clean medical implants or industrial components.

When a fixed surface, such as a wafer, is arranged in an area in which a viscous fluid flows, a flow velocity can substantially converge to 0 due to friction between the fluid and the fixed surface in an area directly adjacent to the fixed surface. In hydromechanics, such an area is called a viscous boundary. According to previous research, when a wafer is submerged in deionized water, a viscous boundary having a height of about 3 μm from the surface of the wafer is formed. Accordingly, after immersing the wafer in the cleaning fluid, it may be challenging to clean fine particles smaller than 3 μm that remain on the wafer, even if the wafer is rotated or the cleaning fluid is circulated. On the other hand, in megasonic cleaning, the formation of cavitations generates shock waves which can spread in an area within the viscous boundary and remove fine particles that remain within the viscous boundary.

Therefore, as semiconductor processes and patterns formed on the wafers become finer, particles that adhere to the wafers become finer, and so the use of megasonic cleaning becomes more useful.

According to some embodiments, side walls 110 and a bottom wall 120 of the internal water tank 100 define an internal space that can accommodate a fluid FLD therein. A structure of the side walls 110 will be described in detail hereinbelow. The fluid FLD includes cleaning fluid and water, such as deionized water, and is accommodated in the internal water tank 100. The cleaning fluid may include organic solvents or water-soluble solvents, but embodiments are not limited thereto. In addition, a water supplier and a cleaning fluid supplier may be provided to the internal water tank 100. An external water tank may be provided outside of the internal water tank 100. The external water tank can filter the fluid FLD that has overflowed the internal water tank 100 and resupply the fluid FLD to the internal water tank 100. A lower portion of the external water tank is connected to a fluid exhaust pipe that is connected to the cleaning fluid supplier or the water supplier. The fluid exhaust pipe includes a pump which maintains a pressure of the fluid above a certain value and pumps the fluid to the cleaning fluid supplier or the water supplier, and a filter that removes contaminants which accumulate in a cleaning process.

In FIGS. 1A through 1E, according to some embodiments, two perpendicular directions which are parallel to an upper surface of a wafer W in the internal water tank 100 will be referred to as a first direction X and a second direction Y, respectively, and a direction substantially perpendicular to the upper surface of the wafer W will be referred to as a third direction Z. The first direction X and the second direction Y are substantially perpendicular to the third direction Z. Directions marked with arrows in the drawings and the opposite directions of the same will be referred to as the same direction. In general, the megasonic cleaner is operated with the bottom wall 120 of the internal water tank 100 substantially parallel to the ground. When the bottom wall 120 is substantially parallel to the ground, the first direction X and the third direction Z is substantially parallel to the ground, and the second direction Y is substantially perpendicular to the ground.

According to some embodiments, transducers 130 are located on the bottom wall 120 of the internal water tank 100. FIGS. 1A and 1B show six transducers 130, but embodiments are not limited thereto, and more or fewer transducers may be provided. The transducers 130 transmit energy in the form of waves, referred to herein as wave-type energy, into the fluid FLD. The transducers 130 are piezoelectric transducers. A piezoelectric transducer is an apparatus which transforms an input pressure into electrical energy, the electrical energy into acoustic energy, and then outputs the energy. For example, the transducers 130 can generate an acoustic field with a frequency having a range of hundreds of kHz, but embodiments are not limited thereto. When the input power of the transducers 130 is increased, cleaning efficiency may also increase, however, as shock waves generated from cavitations increase, patterns formed on the wafer W may collapse, and film quality may be damaged. Therefore, the input power of the transducers 130 is controlled to be in a range at which no damage is caused to the wafer W. When the transducers 130 form an acoustic field within the fluid FLD, each point of the fluid FLD will alternate between decreasing and increasing pressure as a function of time. Accordingly, the fluid FLD is subjected to a repeated contraction and expansion, and when the fluid FLD has an acoustic pressure lower than a steam pressure, cavitations can form. When the fluid FLD has a pressure beyond a certain level, for example, beyond a surface tension of the fluid FLD, the cavitations may explode to generate a shock wave. In FIGS. 1A and 1B, propagation directions of the waves generated by the transducers 130 are illustrated by broken lines or full lines marked with arrows. Here, the wave-type energy propagates perturbations generated in the fluid FLD by the transducers.

According to some embodiments, after a CMP process and other semiconductor manufacturing processes are performed, the wafer W is transferred into the internal water tank 100 by a transfer robot. The wafer W may be a semiconductor device in a partial stage of completion. In some embodiments, the wafer W includes semiconductors such as Si or Ge, or a compound semiconductor such as SiGe, SiC, GaAs, InAs or InP. In another embodiment, the wafer W has an SOI (silicon on insulator) structure. A semiconductor apparatus formed on the wafer W may be a logic device, a D-RAM, a VNAND memory, and so on, but embodiments are not limited thereto. The wafer W is immersed in the fluid FLD accommodated in the internal water tank 100.

According to some embodiments, the wafer W is supported by the plurality of supporting units 140 located in predetermined positions to stably support the wafer W. Some of the plurality of supporting units 140 may be symmetrically positioned.

For example, when three supporting units 140 are provided as illustrated in FIG. 1B, two of the supporting units 140 are symmetrically positioned in the internal water tank 100 with respect to a lowest point on the wafer, and the other supporting unit 140 is located below the symmetrically positioned supporting units 140, closer to the bottom wall 120. In some embodiments, the plurality of supporting units 140 are supporting rollers that rotate the wafer W, however, embodiments are not limited thereto. When the plurality of supporting units 140 are rollers, at least some of the supporting units 140 include an RPM (Revolutions Per Minute) gauge sensor, to measure and control a rotation speed of the wafer W. FIGS. 1A and 1B show three supporting units 140, but embodiments are not limited thereto, and more or fewer supporting units can be provided.

Figure 1C:
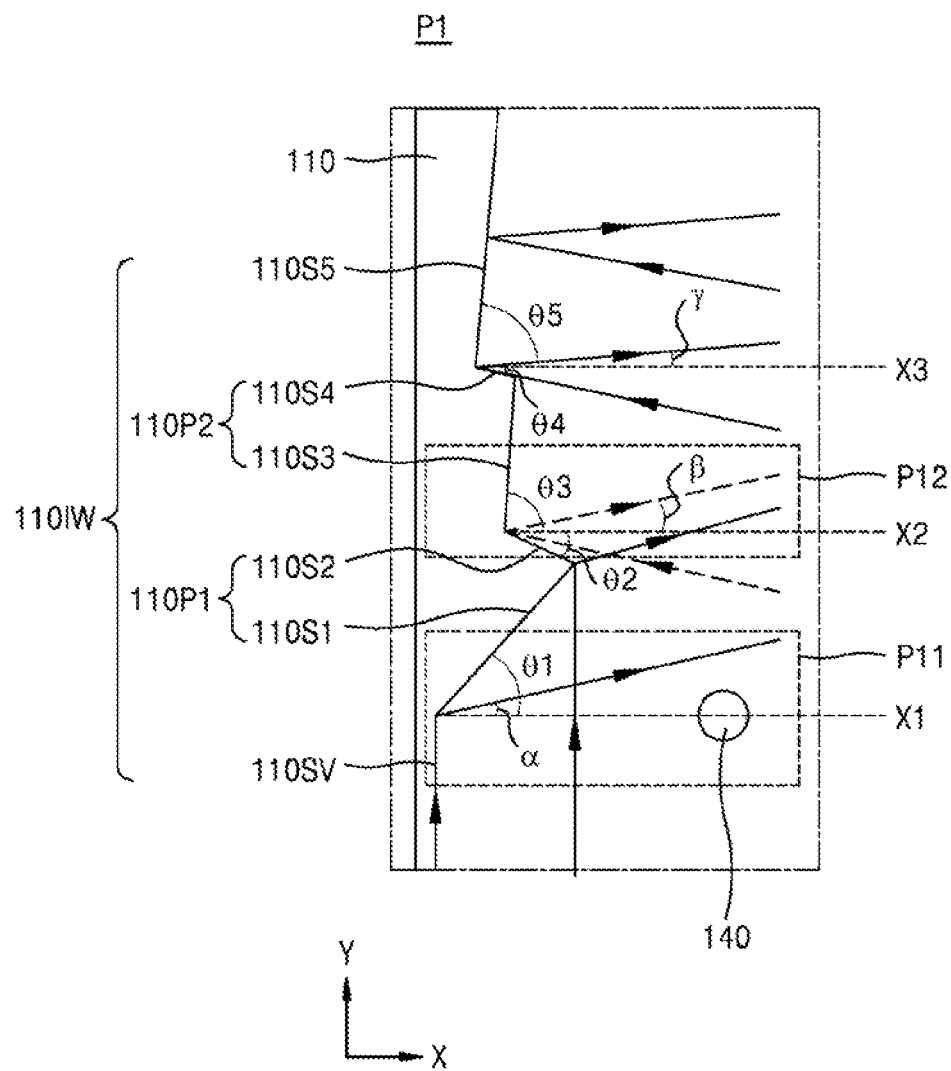
Figure 1D:
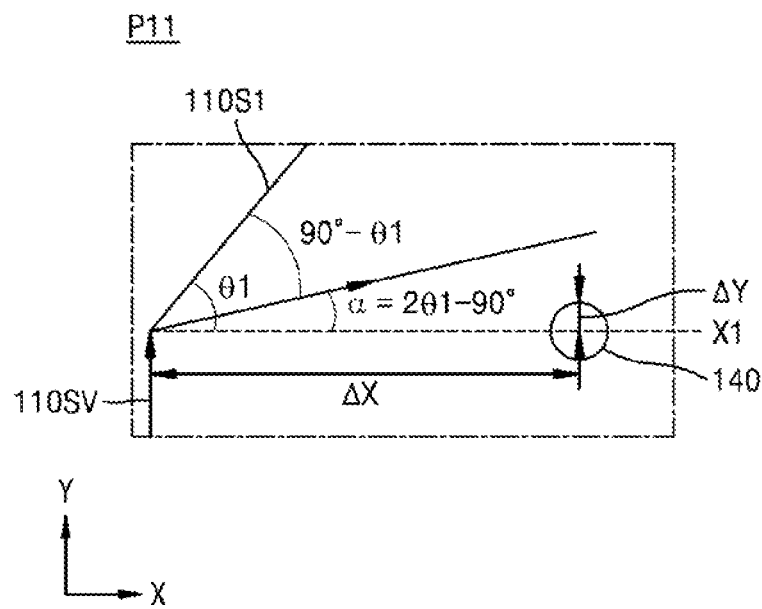
Figure 1E:
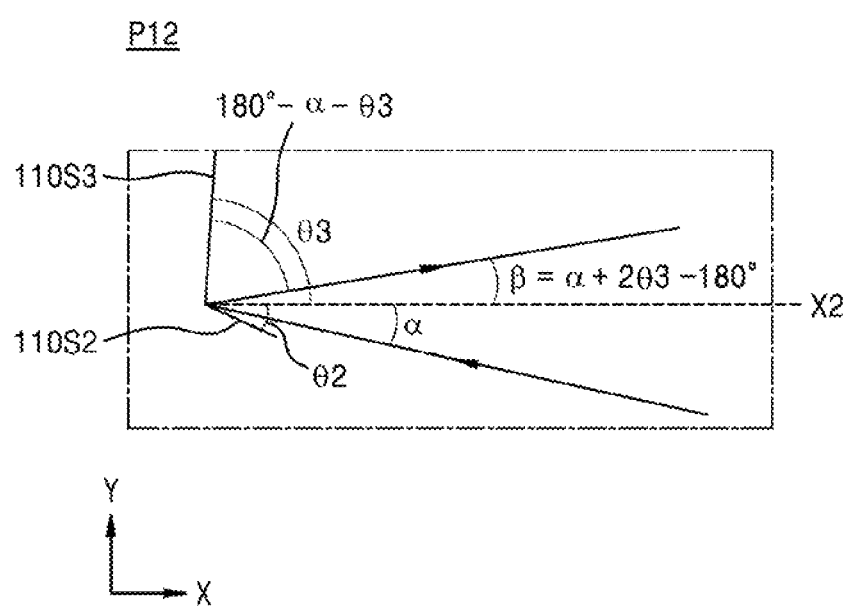

FIG. 1C is an enlarged top-plan view of a portion P1 adjacent to one of opposite inner walls 110IW of FIG. 1B. FIGS. 1D and 1E are enlarged top-plan views of portions P11, P12 respectively. For convenience of explanation, in FIGS. 1C through 1E, components other than portions of the opposite inner walls 110IW and the supporting units 140 are omitted.

According to some embodiments, with reference to FIGS. 1B through 1E, portions of the side walls 110 of the internal water tank 100 are flat plates parallel to the wafer W. Inner walls 110 of the internal water tanks 100 include a pair of opposite inner walls 110IW with the wafer W therebetween. The opposite inner walls 110IW have profiles that are symmetric with respect to the wafer W at the center. Each of the opposite inner walls 110IW has a vertical surface 110SV and first through fifth slopes 110S1, 110S2, 110S3, 110S4, and 110S5. The vertical surface 110SV is a flat plate perpendicular to the bottom wall 120 of the wafer W. A height of the vertical surface 110SV, that is, a length in the second direction Y, is substantially equal to a distance from the bottom wall 120 to a center of one of the supporting units 140 adjacent to the vertical surfaces 110SV. However, embodiments are not limited thereto, and the length of the vertical surfaces 110SV in the second direction Y may be longer or shorter than the aforementioned distance.

According to some embodiments, the first through fifth slopes 110S1, 110S2, 110S3, 110S4, and 110S5 are positioned in this order with respect to the vertical surface 110SV. The first through fifth slopes 110S1, 110S2, 110S3, 110S4, and 110S5 are flat plates with predetermined slopes tilted relative to the bottom wall 120. The first slope 110S1 is connected to the vertical surface 110SV. The second slope 110S2 is connected to the first slope 110S1. The third slope 110S3 is connected to the second slope 110S2. The fourth slope 110S4 is connected to the third slope 110S3. The fourth slope 110S4 is also connected to the fifth slope 110S5. The first, third, and fifth slopes 110S1, 110S3, and 110S5 face the bottom wall 120 or an elongated surface of the same. The first, third, and fifth slopes 110S1, 110S3, and 110S5 have tilted profiles that face an upper surface of the bottom wall 120. The second and fourth slopes 110S2 and 110S4 do not face the bottom wall 120. The second and fourth slopes 110S2 and 110S4 face a direction away from the bottom wall 120.

According to some embodiments, the first through fifth slopes 110S1, 110S2, 110S3, 110S4, and 110S5 have predetermined oblique angles with respect to the bottom wall 120. In this case, two angles can be defined for each combination between the bottom wall 120 and the first through fifth slopes 110S1, 110S2, 110S3, 110S4, and 110S5. Hereinafter, the lesser of two angles formed by two flat planes will be referred to as an angle of two flat planes.

According to some embodiments, first protrusions 110P1 are formed from the first and second slopes 110S1 and 110S2. The first protrusions 110P1 protrude toward an internal space of the internal water tank 100. The first protrusion 110P1 on one of the opposite inner walls 110IW protrudes toward the other opposite inner wall 110IW. The second protrusions 110P2 are formed from the third and fourth slopes 110S3 and 110S4. The second protrusion 110P2 on one of the opposite inner walls 110IW protrudes toward the other opposite inner wall 110IW. The first protrusions 110P1 protrude further into the internal space of the internal water tank 100 than the second protrusions 110P2. The shortest distances between the first protrusions 110P1 and the wafer W is less than the shortest distances between the second protrusions 110P2 and the wafer W. Not being completely fixed to the supporting units 140, the wafer W can vibrate as the supporting units 140 rotate. According to some embodiments, to avoid touching the vibrating wafer W, the first and second protrusions 110P1 and 110P2 are sufficiently spaced apart from the wafer W supported by the supporting units 140.

According to some embodiments, when the plurality of transducers 130 is provided, waves from the outermost transducers 130 reach the first slope 110S1. The first slope 110S1 extends a predetermined distance into the internal space of the water tank 100 and forms a predetermined angle with the bottom wall 120, such that all of the waves generated by the outermost transducers 130 are reflected by the first slope 110S1. However, embodiments are not limited thereto, and waves generated from other transducers 130 can reach the first slope 110S1.

According to some embodiments, waves reflected by the first slope 110S1 on one of the opposite inner walls 110IW reach the third slope 110S3 on the other opposite inner wall 110IW. The third slope 110S3 extends a predetermined distance into the internal space of the water tank 100 and forms a predetermined angle with the bottom wall 120, such that all of the waves reflected by the first slope 110S1 are reflected by the third slope 110S3. However, embodiments are not limited thereto, and only a portion of the waves reflected by the first slope 110S1 may be reflected by the third slope 110S3. Next, the waves reflected by the third slope 110S3 on one of the opposite inner walls 110IW reach the fifth slope 110S5 on the other opposite inner walls 110IW. The fifth slope 110S5 extends a predetermined distance into the internal space of the water tank 100 and forms a predetermined angle with the bottom wall 120, such that all of the waves reflected by the third slope 110S3 are reflected by the fifth slope 110S5. However, embodiments are not limited thereto, and only a portion of the waves reflected by the third slope 110S3 may reach the fifth slope 110S5.

According to some embodiments, the waves generated by the transducers 130, after reaching the opposite inner walls 110IW, propagate according to the law of reflection. In other words, angles of incidence angles and angles of reflection of the waves for the opposite inner walls 110IW are substantially equal. In this case, the angles of incidence and the angles of reflection are defined with respect to vector normal to a plane of incidence. As illustrated, angles formed by the first through fifth slopes 110S1, 110S2, 110S3, 110S4, and 110S5 with respect to the bottom wall 120 or with respect to a plane formed by the first direction X and the third direction Z are referred to as first through fifth oblique angles θ1, θ2, θ3, θ4, and θ5.

Here, according to some embodiments, with reference to FIG. 1D, as the transducers 130 transmit linear waves into the fluids FLD, the propagation directions of the waves toward the first slope 110S1 are substantially perpendicular to the bottom wall 120. In this case, first through third auxiliary lines X1, X2, and X3 are hypothetical lines substantially parallel to the first direction X. The first auxiliary line X1 extends from an intersection of the vertical surface 110SV and the first slope 110S 1 in a direction substantially parallel to the first direction X. The second auxiliary line X2 extends from an intersection of the second slope 110S2 and the third slope 110S3 in a direction substantially parallel to the first direction X. The third auxiliary line X3 extends from an intersection of the fourth slope 110S4 and the fifth slope 110S5 in a direction substantially parallel to the first direction X. Based on a geometric analysis that the first direction X and the second direction Y cross at a right angle, those skilled in the art may understand that the incidence angles of the waves reaching the first slope 110S1 are equal to the first oblique angle θ1. Thus, an angle formed by the first slope 110S1 and the propagation direction of the waves being reflected from the first slope 110S1 is 90°−θ1. According to embodiments, a first pointing angle α, formed by the bottom wall 120 and propagation direction of the waves reflected by the first slope 110S1, are determined by Equation 1, presented below.

$$\alpha = 2\theta_1 - 90°. \quad \text{Equation 1:}$$

In this case, according to embodiments, the waves propagate in directions substantially away from the bottom wall 120 of the internal water tank 100. Accordingly, the first oblique angle θ1 has a range specified by Equation 2, below.

$$0° < \theta_1 < 45°. \quad \text{Equation 2:}$$

In addition, according to embodiments, the first oblique angle θ1 has a predetermined value which prevents the waves reflected by the first slope 110S1 from reaching the supporting units 140. The first oblique angle θ1 has a predetermined value such that the waves reflected by the first slope 110S1 propagate over the supporting units 140.

Referring to FIG. 1D, according to embodiments, referring to a displacement in the first direction X from an intersection of the first slope 110S1 and the vertical surface 110SV to the most adjacent supporting unit as a first horizontal displacement ΔX, and referring to a displacement in the second direction Y as a first vertical displacement ΔY, the first pointing angle α satisfies Equation 3, below.

$$\arctan\left(\frac{\Delta Y1}{\Delta X1}\right) < \alpha, \qquad \text{Equation 3}$$

where arctan is the inverse tangent function.

According to embodiments, the second slope 110S2 on one opposite inner walls 110IW forms a predetermined oblique angle θ2 with the bottom wall 120 such that the waves reflected by the first slope 110S1 on the other opposite inner wall 110IW do not reach the second slope 110S2. However, embodiments are not limited thereto, and angle formed by the second slope 110S2 and the bottom wall 120 may be such that a portion of the waves reflected by the first slope 110S1 reach the second slope 110S2. The second oblique angle θ2 of the second slope 110S2 is less than or equal to the first pointing angle α. Based on the cavitation distribution or acoustic field distribution to be implemented, the second slope 110S2 extends a predetermined distance into the internal space of the water tank 100 at the predetermined oblique angle θ2.

According to embodiments, an angle between the second slope 110S2 and the third slope 110S3 is a sum of the second oblique angle θ2 and a third oblique angle θ3. When the sum of the second and third oblique angles θ2 and θ3 is less than or equal to 90 degrees, turbulence may form in a space between the second and third slopes 110S2 and 110S3. Accordingly, fine particles removed from the upper surface of the wafer W may be captured by the turbulence without being released outwards, and may reattach to the wafer W. The second and third slopes 110S2 and 110S3 are positioned to be free from turbulence between them. The sum of the second and third oblique angles θ2 and θ3, that is, θ2+θ3, is greater than or equal to 90 degrees.

With reference to FIG. 1E, according to embodiments, waves which encounter the third slope 110S3 at the first pointing angle α are reflected by the third slope 110S3 and propagate at a second pointing angle θ with respect to the bottom wall 120. The second pointing angle β has a predetermined relationship with the first pointing angle α and the third oblique angle θ3. The second pointing angle β can be determined by Equation 4, below.

$$\beta = 2\theta 3 + \alpha - 180°. \qquad \text{Equation 4:}$$

Accordingly, as in Equation 5, below, the second pointing angle β is determined by the first and third oblique angles θ1 and θ3.

$$\beta = 2\theta 1 + 2\theta 3 - 270°. \qquad \text{Equation 5:}$$

According to embodiments, the relationship of the second point angle β with respect to the first pointing angle α and the third oblique angle θ3 is similar to a relationship of a third pointing angle γ with respect to the second pointing angle β and a fifth oblique angle θ5, where the third pointing angle γ is a propagation direction of waves reflected from the fifth slope 110S5, and the fifth oblique angle θ5 is the angle formed by the fifth slope 110S5 and the third auxiliary line X3. Therefore, Equation 5 can be applied to the third pointing angle γ. As in Equation 6, below, the third pointing angle γ can be determined by the first, third, and fifth oblique angles θ1, θ3, and θ5.

$$\gamma = 2\theta 1 + 2\theta 3 + 2\theta 5 - 450°. \qquad \text{Equation 6:}$$

According to embodiments, the first pointing angle α is greater than the second pointing angle β, the second pointing angle β is greater than the third pointing angle γ, and thus the first pointing angle α is greater than the third pointing angle γ, but embodiments are not limited thereto. According to some embodiments, the first through third pointing angles α, β, and γ, which define propagation direction of waves reflected by the opposite inner walls 110IW, can be determined by the first, third, and fifth oblique angles θ1, θ3, and θ5. Accordingly, it is possible to implement an acoustic field distribution and/or a cavitation distribution by setting the first, third, and fifth slopes θ1, θ3, and θ5 to have predetermined values.

In addition, according to embodiments, the fourth slope 110S4 on one of the opposite inner walls 110IW forms an oblique angle θ4 with respect to third auxiliary line X3 such that waves reflected by the third slope 110S3 of other opposite inner wall 110IW do not reach the fourth slope 110S4. However, embodiments are not limited thereto, and a portion of the waves reflected by the third slope 110S3 may reach the fourth slope 110S4. The fourth slope 110S4 faces a direction away from the bottom wall 120, and the fourth oblique angle θ4 is less than or equal to the second pointing angle β. Based on the acoustic field to be implemented, the fourth slope 110S4 extend an appropriate distance into the internal space of the water tank 100 and forms the predetermined oblique angle θ4 with the bottom wall 120.

With reference to FIGS. 1A and 1B, according to embodiments, five slopes are shown, three of which face the bottom wall, and two of which face away from the bottom wall, but embodiments are not limited thereto. Based on the cavitation distribution or acoustic field distribution to be implemented, more or fewer slopes may be provided. Accordingly, more or fewer than three protrusions may be provided.

Figure 4A:
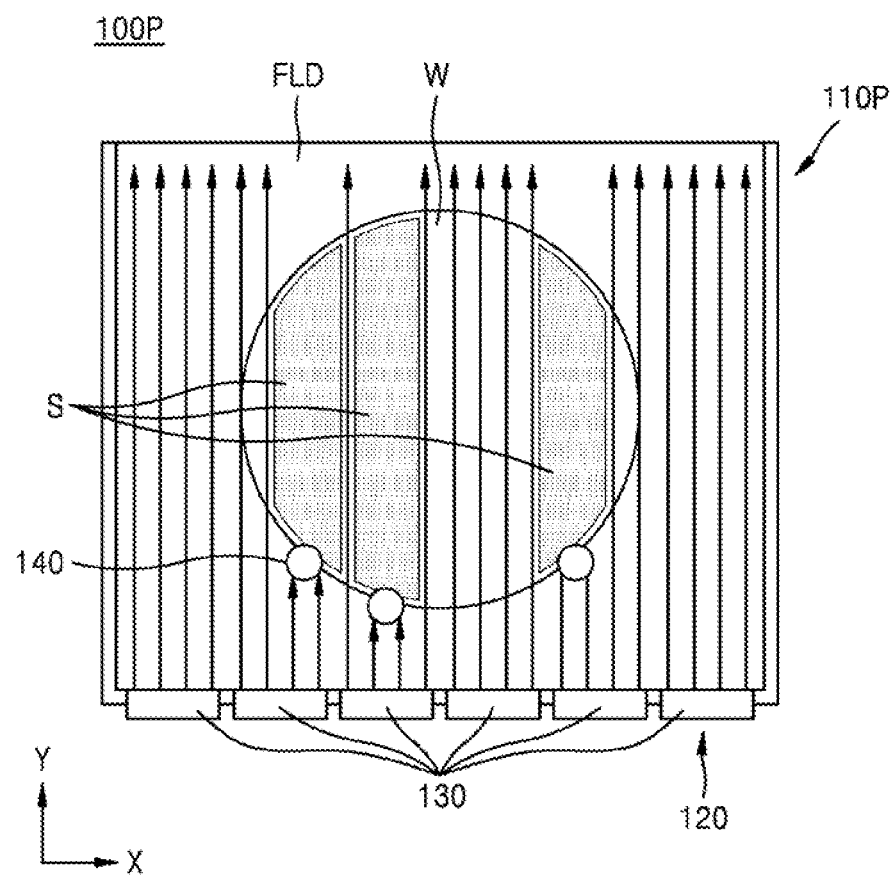
FIGS. 4A and 4B illustrate effects of an internal water tank included in a megasonic cleaner, according to some embodiments.
Figure 4B:
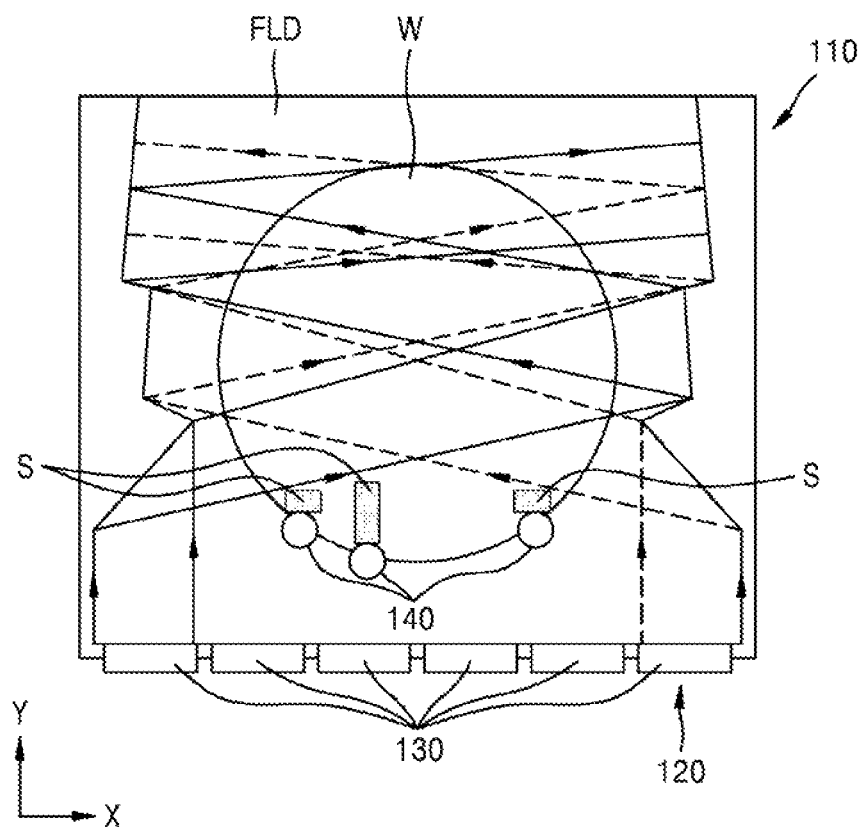

FIGS. 4A and 4B are top plan views illustrating effects of a water tank according to embodiments of the present disclosure.

Referring to FIG. 4A, a conventional internal water tank 100P includes side walls 110P connected to the bottom wall 120 and substantially perpendicular thereto. A wafer W positioned in the conventional internal water tank 100P includes shaded areas S in which substantially no cavitations form. Substantially no cavitations form in the shaded areas S because those areas are covered by the plurality of supporting units 140 on the wafer W which block waves generated by the transducers 130 from reaching them, because the waves propagate in a direction perpendicular to the bottom wall 120. According to results of experiments, no cavitations form on portions that correspond to approximately 30% of the wafer W. This type of irregular cavitation distribution leads to a reduction in uniformity and efficiency of cleaning. Although the supporting units 140, which are roller-shaped, rotates the wafer W to address this situation, however, uniformity and efficiency of cleaning were still lower than in a case where cavitations are uniformly distributed on the entire surface of the wafer W. Accordingly, fine particles that remain on the wafer W can cause defects such as scratches, breaks or chips in the wafer W in subsequent processes, such as brush scrubbing, etc. Such defects can decrease the manufacturing yield of a semiconductor device. In addition, at least part of the wave-type energy generated by the transducers 130 is wasted without reaching the wafer W.

With reference to FIG. 4B, the internal water tank 100 according to exemplary embodiments includes opposite inner walls 110IW that include a plurality of slopes. Accordingly, wave-type energy generated by the transducers 130 is reflected by the opposite inner walls 110IW and propagates over most of the wafer W. According to some embodiments, cavitations form on portions that correspond to more than 95% of the wafer W. Accordingly, a megasonic cleaner can be provided in which cavitations form uniformly on the entire surface of the wafer W in the internal water tank 100. Thus, cleaning efficiency and reliability of the megasonic cleaner can be increased, and a production yield can be increased by protecting against the occurrence of failures in subsequent processes.

Figure 2A:
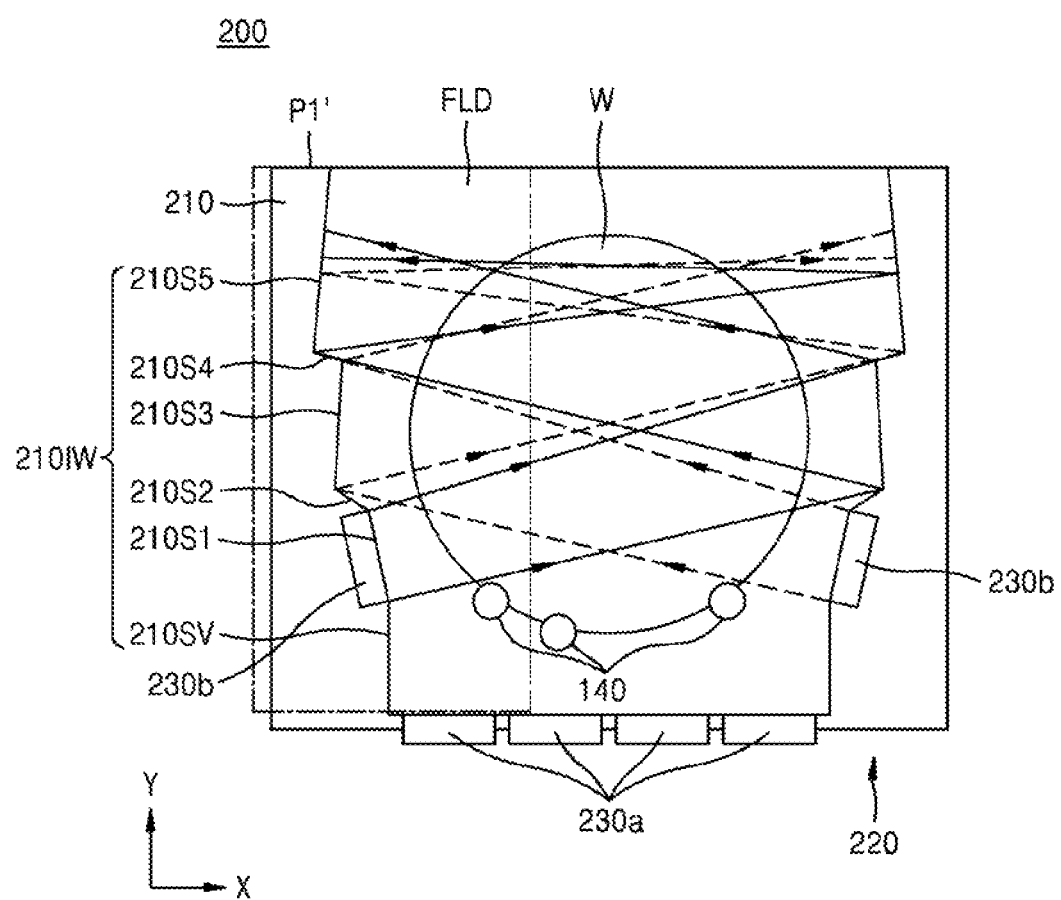
FIGS. 2A through 2C are top plan views of an internal water tank included in a megasonic cleaner, according to some embodiments.
Figure 2B:
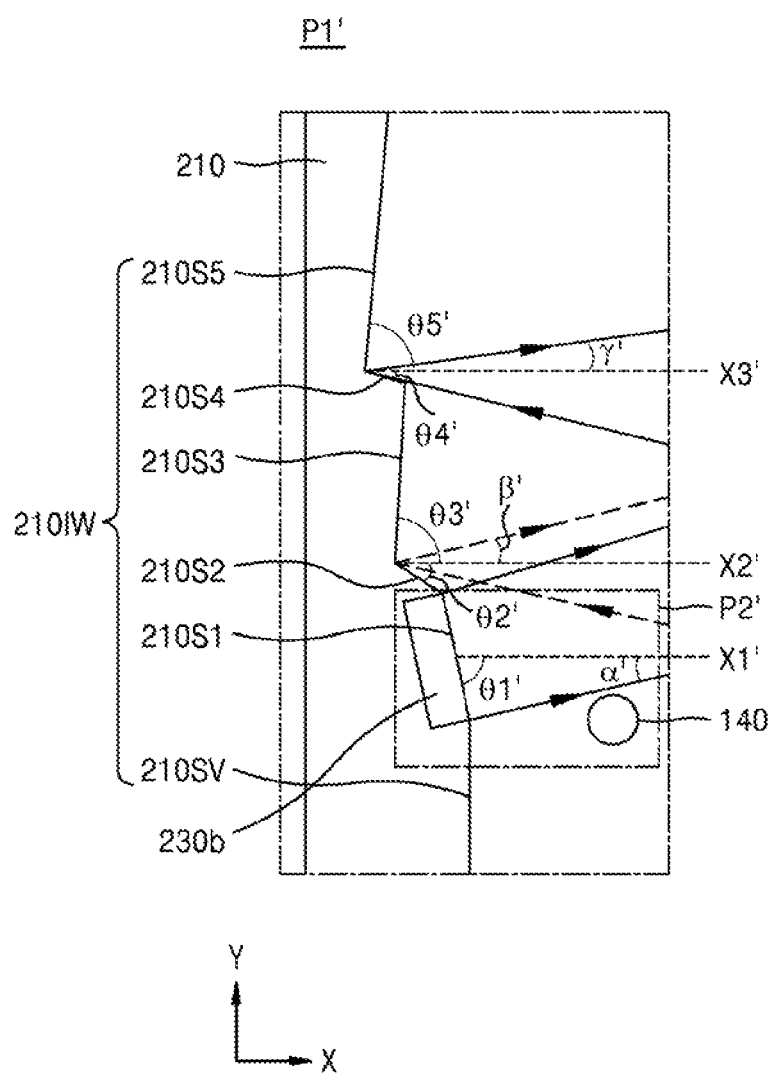
Figure 2C:
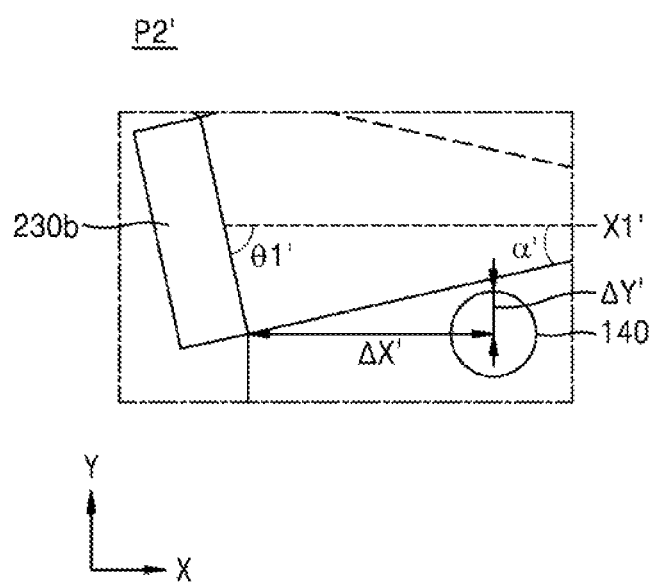

FIG. 2A is a top plan view of an internal water tank 200 which can be included in a megasonic cleaner according to some embodiments of the disclosure. FIG. 2B is an enlarged top-plan view of a portion P1' adjacent to opposite inner walls 210IW in FIG. 2A, and FIG. 2C is an enlarged top-plan view of a portion P2' of FIG. 2B. For convenience of description, descriptions of components substantially similar to those presented with reference to FIGS. 1A through 1E are omitted, and differences thereof will be mainly described hereinafter.

With reference to FIGS. 2A to 2C, according to embodiments, an internal water tank 200 includes a bottom wall 220, side walls 210 that include a pair of opposite inner walls 210IW, and the plurality of supporting units 140. The internal water tank 200 can accommodate the fluid FLD therein, and the fluid FLD is substantially the same as that described with reference to FIG. 1A. The pair of opposite inner walls 210IW each include a vertical surface 210SV which is substantially perpendicular to the bottom wall 220 and connected thereto. The pair of opposite inner walls 210IW include first through fifth slopes 210S1, 210S2, 210S3, 210S4, and 210S5 which form the inner side walls 210IW in this order and connected to each other in this order.

According to embodiments, the first through fifth slopes 210S1, 210S2, 210S3, 210S4, and 210S5 form first through fifth oblique angles θ1', θ2', θ3', θ4', and θ5' with an upper surface of the bottom wall 220, respectively, in that order. First to third auxiliary lines X1', X2', and X3' of FIGS. 2B and 2C are parallel to the first direction X. The first auxiliary line X1' extends from the first slope 210S1 in the first direction X. The second auxiliary line X2' extends in the first direction X from a point where the second slope 210S2 and the third slope 210S3 intersect. The third auxiliary line X3' extends in the first direction X from a point where the fourth slope 210S4 and the fifth slope 210S5 intersect.

According to embodiments, first transducers 230a are arranged on the bottom wall 220 and are substantially the same as the transducers 130 described with reference to FIGS. 1A through 1E. Second transducers 230b are arranged on the opposite inner walls 210IW and are substantially the same as the transducers 130 described with reference to FIGS. 1A through 1E. The second transducers 230b are positioned on the first slopes 210S1 of the opposite inner walls 210IW. The second transducers 230b transmit into the fluid FLD energy in the form of waves, referred to herein as wave-type energy, that propagates in directions substantially perpendicular to the first slope 210S1. Accordingly, a first pointing angle α1' formed by the bottom wall 220 and the propagation direction of waves generated by the second transducers 230b can be determined by Equation 7, below.

$$\alpha'=90°-\theta1'.$$ Equation 7:

According to some embodiments, the first slope 210S1 faces in a direction away from the bottom wall 220 or an elongated flat plate of the same. The first slope 210S1 faces an upper surface of the fluid in the internal water tank 200. Accordingly, waves generated by the second transducers 230b propagate upward. The waves propagate in directions away from the bottom wall 220 of the internal water tank 200. Accordingly, the first oblique angle θ1' has a range expressed by Equation 8, below.

$$0°<\theta1'<90°.$$ Equation 8:

With reference to FIGS. 2A through 2C, according to embodiments, lowermost portions of the first slope 210S1 correspond to the centers of the supporting units 140 closest to the first slope 210S1. In other words, distances along the second direction Y between the lowermost portions of the first slope 210S1 and the bottom wall 220 are substantially equal to distances between the centers of the supporting units 140 closest to the first slope 210S1 and the bottom wall 220. However, embodiments are not limited thereto, and the lowermost portions of the first slope 210S1 may also be spaced apart from the bottom wall 220 by a greater or lesser distance than the centers of the supporting units 140 closest to the first slope 210S1.

According to some embodiments, waves generated from the second transducers 230b propagate above the plurality of supporting units 140 closest to the second transducers 230b. Referring to a first displacement in the first direction X between the lowermost portion of the second transducers 230b and the supporting units 140 closest thereto as ΔX', and a second displacement in a second direction Y as ΔY', the first pointing angle α satisfies Equation 9, below.

$$\arctan\left(\frac{\Delta Y1'}{\Delta X1'}\right)<\alpha'.$$ Equation 9

Next, according to embodiments, as relationships and definitions of the second through fifth oblique angles θ2', θ3', θ4', and θ5' and second and third pointing angles β' and γ' are similar to those described with reference to FIGS. 1C through 1E, detailed descriptions are omitted.

According to exemplary embodiments, wave-type energy transmitted into the fluid FLD by the second transducers 230b propagates above the supporting units 140, is reflected by the opposite inner walls 210IW, and propagates uniformly above the entire wafer W. Accordingly, portions of areas on the wafer W covered by the supporting units 140 is decreased. Thus, a megasonic cleaner can be provided which provides a uniform cavitation distribution throughout surfaces of the wafer W.

Figure 3:
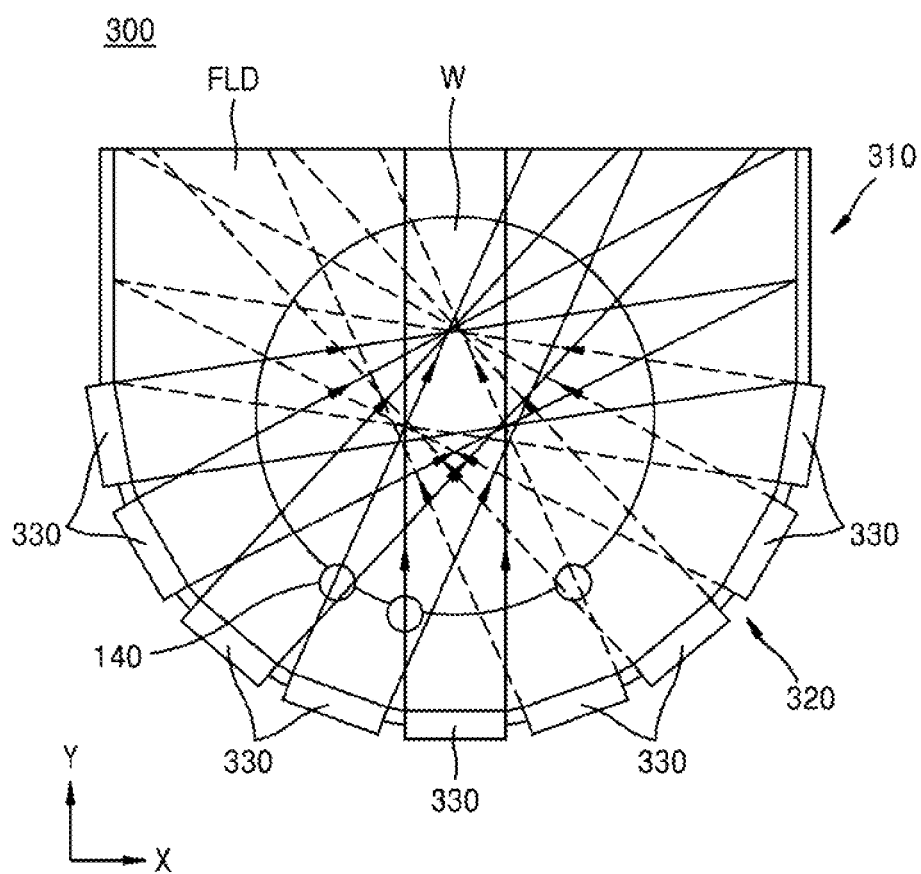
FIG. 3 is a top plan view of an internal water tank included in a megasonic cleaner, according to some embodiments.

FIG. 3 is a top plan view of an internal water tank 300 which can be included in a megasonic cleaner according to exemplary embodiments of the disclosure.

For convenience of explanation, descriptions substantially similar to those presented with reference to FIGS. 1A through 1E are omitted, and differences thereof will be mainly described hereinafter.

With reference to FIG. 3, according to embodiments, a internal water tank 300 includes a bottom wall 320, side walls 310 connected thereto, and the fluid FLD accommodated therein within an internal space. Here, the internal space is the space between the side walls 310 and the bottom wall 320. The internal water tank 300 includes the plurality of supporting units 140 that support the wafer W.

According to some embodiments, the bottom wall 320 has a curved surface. The bottom wall 320 is a U-shaped wall. A profile of the upper surface of the bottom wall 320 may be an semi-ellipse, a semi-circle, a parabola, or a hyperbola. Transducers 330 are provided on the bottom wall 320.

According to some embodiments, as the transducers 330 are substantially the same as the transducers 130 described with reference to FIG. 1A, detailed descriptions thereof are omitted. The transducers 330 are distributed uniformly along the bottom wall 320. For example, a plurality of transducers 330 can be arranged at equal intervals along the bottom wall 320. The transducers 330 are spaced apart along the curved surface of the bottom wall 320, and the separation distances between adjacent transducers along the curved surface of the bottom wall 320 are substantially equal. However, embodiments are not limited thereto, and a single transducer 330 extending along substantially the entire bottom wall 320 may be provided.

According to some embodiments, the transducers 330 transmit wave-type energy into the fluid FLD in directions perpendicular to each portion of the bottom wall 320. Accordingly, portion of the wafer W covered by the supporting units can be decreased. Accordingly, a megasonic cleaner can be provided which has a substantially uniform cavitation distribution on the entire surface of the wafer W.

Embodiments of the present inventive concept have been described with reference to exemplary embodiments shown in the drawings, but only to illustrate possible examples, and those skilled in the art will understand that exemplary embodiments of the present inventive concept can be variously modified without departing from the spirit and the scope of the embodiments of the present inventive concept as set forth in the attached claims.

What is claimed is:

1. A megasonic cleaner, comprising:
   a tank that includes a pair of opposite inner walls and a bottom wall connected thereto, and that accommodates a fluid therein;
   a plurality of supporting units arranged at predetermined positions in the tank and that support a wafer; and
   at least one transducer arranged on the bottom wall and configured to transmit energy in the form of waves into the fluid,
   wherein each of the pair of opposite inner walls includes a first protrusion that protrudes into an internal space of the tank and a second protrusion that protrudes into the internal space of the tank and is positioned above each of the first protrusions,
   a shortest distance between each of the first protrusions and the bottom wall is greater than or equal to distances between centers of the plurality of supporting units and the bottom wall, and
   wherein each of the first protrusions includes a first slope that is flat and faces the bottom wall, and a second slope that is connected to the first slope, is flat, and extends up ward from the bottom wall and away from the wafer, and
   wherein each of the second protrusions includes a third slope that faces the bottom wall and is connected to the second slope of the corresponding first protrusion.

2. The megasonic cleaner according to claim 1, wherein each of the first protrusions is configured to reflect at least a portion of the waves transmitted from the at least one transducer, and the waves reflected by each of the first protrusions propagate in a direction away from the bottom wall.

3. The megasonic cleaner according to claim 1, wherein the pair of opposite inner walls are symmetrically arranged with respect to the wafer located at a center therebetween.

4. The megasonic cleaner according to claim 2, wherein the waves reflected by each of the first protrusions propagate above the plurality of supporting units.

5. The megasonic cleaner according to claim 1, wherein each of the first slopes is closer to the bottom wall than each of the second slopes.

6. The megasonic cleaner according to claim 1, wherein the pair of opposite inner walls includes a first inner wall and a second inner wall, wherein an angle formed by the first slope of the first inner wall and a line parallel to the bottom wall is greater than 45 degrees and less than 90 degrees, and an angle formed by the first slope of the second inner wall and a line parallel to the bottom wall is greater than 45 degrees and less than 90 degrees.

7. The megasonic cleaner according to claim 1, wherein the pair of opposite inner, walls each comprise a vertical surface that connects each of the first slopes to the bottom wall and is perpendicular to the bottom wall.

8. The megasonic cleaner according to claim 1, wherein each of the first protrusions protrudes further into the internal space of the tank than does each of the second protrusions.

9. The megasonic cleaner according to claim 1, wherein each second protrusion includes a fourth slope connected to the corresponding third slope of the second protrusion.

10. The megasonic cleaner according to claim 9, wherein a first pointing, angle between a propagation direction of the waves reflected by each first slope and a line parallel to the bottom wall is greater than a second pointing angle between a propagation direction of waves reflected by the corresponding third slope and a line parallel to the bottom wall.

* * * * *